(12) United States Patent
Uematsu et al.

(10) Patent No.: US 7,187,069 B2
(45) Date of Patent: Mar. 6, 2007

(54) SEMICONDUCTOR DEVICE

(75) Inventors: Yutaka Uematsu, Yokohama (JP); Hideki Osaka, Oiso (JP); Yoji Nishio, Sagamihara (JP); Yukitoshi Hirose, Chigasaki (JP)

(73) Assignee: Elpida Memory, Inc., Tokyo (JP)

( * ) Notice: Subject to any disclaimer, the term of this patent is extended or adjusted under 35 U.S.C. 154(b) by 55 days.

(21) Appl. No.: 10/981,676

(22) Filed: Nov. 5, 2004

(65) Prior Publication Data

US 2006/0017144 A1    Jan. 26, 2006

(30) Foreign Application Priority Data

Jul. 21, 2004    (JP)    ............................. 2004-212654

(51) Int. Cl.
 *H01L 23/02*    (2006.01)
 *H01L 23/34*    (2006.01)
(52) U.S. Cl. ...................................... 257/685; 257/723
(58) Field of Classification Search ................ 257/685, 257/686, 691, 723, 724, 738, 777
See application file for complete search history.

(56) References Cited

U.S. PATENT DOCUMENTS 6,833,626 B2 * 12/2004 Kajiwara et al. ........... 257/777
6,914,259 B2 *  7/2005 Sakiyama et al. ............ 257/48

FOREIGN PATENT DOCUMENTS

JP       5-29531    2/1993
JP       6-140215   5/1994

* cited by examiner

*Primary Examiner*—Hung Vu
(74) *Attorney, Agent, or Firm*—Mattingly, Stanger, Malur & Brundidge, P.C.

(57) ABSTRACT

The present invention provides a technique which, without causing two problems, i.e., (1) increased number of power supply/grounding pins and (2) increased power feed line inductance, prevents the noise causing a problem in a control circuit, from becoming routed around and induced into an output buffer. More specifically, the above can be realized by using either of two methods: (A) providing an on-chip bypass capacitor for the control circuit and isolating a power feed route of the control circuit from that of the output buffer in an AC-like manner, or (B) designing electrical parameters (inserting resistors) such that the oscillation mode of any electrical parameter noise induced into the power feed routes will change to overdamping.

2 Claims, 10 Drawing Sheets

US 7,187,069 B2

SEMICONDUCTOR DEVICE

CLAIM OF PRIORITY

The present application claims priority from Japanese application serial No. 2004-212654, filed on Jul. 21, 2004, the content of which is hereby incorporated by reference into this application.

BACKGROUND OF THE INVENTION

1. Field of the Invention

The present invention relates to a semiconductor device, semiconductor package design, and components mounting therein, for reducing the noise occurring in the power feed line (wiring) of the semiconductor devices which handle high-speed signals for use in information-processing apparatus and the like.

2. Description of the Related Art

In the semiconductor devices that handle high-speed signals, the simultaneous switching output (SSO) noise generated by simultaneous switching of a large number of switching elements, each formed up of a CMOS and others, is becoming a problem. There are two types of SSO noise. One type is Off-Chip SSO noise due to the switching of the switching elements (such as the CMOS of an output butter) that are used to transmit off-chip signals between independent semiconductor elements. The other type is On-Chip SSO noise due to the switching of the switching elements (such as the CMOS's in the core circuit of a pre-buffer or control system) that are used to transmit on-chip signals.

Of the two types, On-Chip SSO noise, in particular, is the greater in time constant (i.e., the time required for the noise to attenuate is as long as on the order of nanoseconds). On-Chip SSO noise, therefore, poses a significant problem due to the fact that during the handling of high-speed signals exceeding a Giga-bit per second (Gbps) level, the noise generated by the next signal is superimposed on the noise generated by the previous signal. In a prior art, there has been a method in which an independent power supply line is provided in such a control circuit and an output buffer each in order that the noise generated by the control circuit does not become routed around and induced into the output buffer (refer to Japanese Patent Laid-Open No. Hei 5-29531).

As with a prior art, however, the method in which an independent power supply line is provided in the control circuit and the output buffer each, has involved the following problems:

(1) Increased number of power supply and grounding pins (2) Increased inductance in power feed lines Above item (1) means an increase in the number of semiconductor package and semiconductor device pins due to the provision of an independent power supply/grounding line in the control circuit and the output buffer each, and increases the dimensions and cost of the semiconductor device.

Above item (2) means that since two power feed lines are formed in a limited area, the resulting decrease in the width of the power feed line increases inductance, resulting in noise reduction being adversely affected.

SUMMARY OF THE INVENTION

The present invention provides a technique which, without causing the above two problems, i.e., (1) increased number of power supply/grounding pins and (2) increased inductance in power feed lines, prevents the noise causing a problem in a control circuit, from becoming routed around and induced into an output buffer.

In the present invention, the On-Chip SSO noise becoming a problem in the power feed route of the control circuit is suppressed by applying the following two techniques to solve the above problems:

Technique 1: An on-chip bypass capacitor for the control circuit is provided and the power feed route of the control circuit is isolated from higher frequency component of the output buffer to suppress switching noise.

Technique 2: Electrical parameters are designed (resistors are inserted) such that the oscillation mode of the noise decided by any electrical parameter of the power feed routes will change to overdamping.

In Technique 1, a method is provided that changes the route of an electric current in the event of On-Chip SSO noise so that the switching of switching elements in the control circuit does not contribute to the occurrence of the noise.

In Technique 2, a method is provided in which, by using for convenience's sake the power feed route of a semiconductor device that includes a semiconductor package, as an electric circuit equivalent to a secondary circuit or the like, and using the conditional expression derived from an electrical equation for the secondary circuit, electrical parameters are designed so that the noise current occurring in the power feed circuit changes from an underdamped state to an overdamped state. More specifically, resistors based on the conditional expression are inserted into the power feed circuit.

The semiconductor device of the present invention provides a method that reduces On-Chip SSO noise, which is due to the switching of the control circuit, without isolating the power feed routes of the control circuit and the output buffer in a physical manner.

This yields the advantage that the On-Chip SSO noise deemed to become a significant problem in a semiconductor device which handles high-speed signals exceeding a Gbps level can be suppressed without increasing the number of power supply/grounding pins required or the wiring inductances of the power feed lines.

DESCRIPTION OF THE PREFERRED EMBODIMENTS

The effects of On-Chip SSO noise on output buffers in a semiconductor device which handles high-speed signals are reduced without the number of power supply/grounding pins required being increased or power feed line inductance being increased.

(Embodiment 1)

Before embodiments are described, how On-Chip SSO noise occurs is described below.

Figure 7:
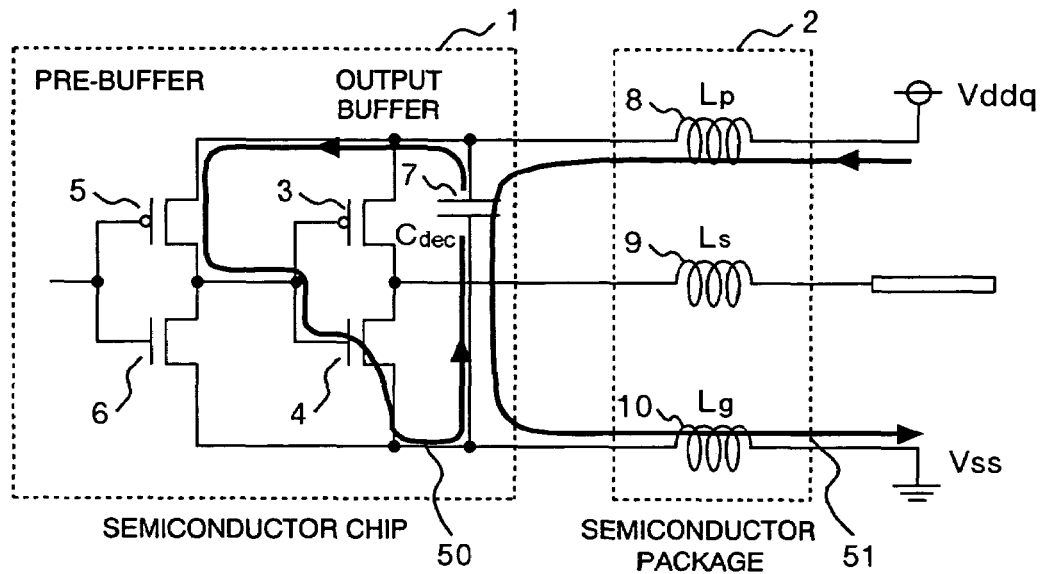
FIG. 7 is an explanatory diagram showing how On-Chip SSO noise occurs.

A schematic diagram of internal circuits of a semiconductor device for transmitting electrical signals to the outside of a chip by switching a CMOS section of an output buffer is shown in FIG. 7. The semiconductor device is constituted by the semiconductor chip shown as 1 in FIG. 7, and the semiconductor package of 2 in FIG. 7 that seals the semiconductor chip, and a power supply voltage "Vddq" based on a grounding potential "Vss" is fed from the system to the semiconductor device. In FIG. 7, only two stages, i.e., an output buffer formed as a CMOS section having the PMOS and NMOS denoted by reference numerals 3 and 4, respectively, and a pre-buffer formed as a CMOS section having the PMOS and NMOS denoted by reference numerals 5 and 6, respectively, are depicted for simplification of the figure. Actually, however, plural output buffers and pre-buffers are present. For the sake of convenience, only a single unit is depicted since the noise herein discussed assumes a simultaneous change in the states of a large number of switching elements. Internal power feed lines, i.e., power supply line and grounding line, of the semiconductor package are also depicted as one integrated line, for simplification of the figure. Actually, however, plural lines are usually used to feed power. Consider a case in which the output buffer has its output state changed from "High" to "Low". At this time, in order to turn on the NMOS 4 of the output buffer, the pre-buffer has its PMOS 5 charged and its NMOS 6 discharged, and the output buffer has its PMOS 3 discharged and its NMOS 4 charged. These elements are then each supplied with a charge from an on-chip bypass capacitor 7, the electric-charge storage element closest to the output buffer. At this time, a current flows via a route 50 as shown. Accordingly, the amount of charge within the on-chip bypass capacitor 7 temporarily becomes insufficient and a charge is supplied from the power feed line in order to compensate for the insufficiency. That is to say, a current flows through a power supply line 8 and a grounding line 10 of the semiconductor package, thus charging the bypass capacitor by taking a route 51 as shown. The semiconductor package has its wiring governed by inductance, and an internal wiring inductance value of the chip is almost negligibly small. An equivalent circuit of the current route 51, therefore, can be regarded as an RLC series secondary circuit with series-connected elements having a wiring inductance "$L_{pkg}=(L_p+L_g)$" of the semiconductor package, an on-chip capacitance "$C_{dec}$" of the semiconductor chip, and a low wiring resistance "$R_{pg}$". It is already mathematically known that the circuit equation as shown in expression 2 below holds for such a circuit.

$$\frac{d^2 V_c}{dt^2} + \frac{R_{pg}}{L_{pkg}} \cdot \frac{dV_c}{dt} + \frac{1}{L_{pkg}C_{dec}}V_c = 0 \qquad \text{(Expression 2)}$$

where "$V_c$" is a difference in potential between electrodes of "$C_{dec}$". The following two parameters are newly defined:

$$\omega_0 \equiv \frac{1}{\sqrt{L_{pkg}C_{dec}}} \qquad \text{(Expression 3)}$$

$$\alpha \equiv \frac{R_{pg}}{2L_{pkg}} \qquad \text{(Expression 4)}$$

A parameter (quality factor) Q that denotes quality of the circuit is represented as follows using "$\omega_0$" and "$\alpha$" defined by above expressions 3 and 4, respectively:

$$Q \equiv \frac{\omega_0}{2\alpha} = \frac{\sqrt{L_{pkg}/C_{dec}}}{R_{pg}} = \frac{\omega_0 L_{pkg}}{R_{pg}} \qquad \text{(Expression 5)}$$

Depending on the relationship in magnitude between a value of Q and ½, zeroth-order input response exhibits one of three kinds of behavior. First, if Q>½, this means underdamping and there is such a current flow as represented by expression 6.

$$I=I_0 \cdot e^{-\alpha t} \cos(\omega_d t+\phi) \qquad \text{(Expression 6)}$$

where "$I_0$" is a maximum current amplitude value determined by an initial circuit voltage state, inductance, and capacitance, and "$\phi$" and "$\omega_d$" are phase and angular frequency defined by expression 7, respectively.

$$\omega_d \equiv \sqrt{\omega_0^2-\alpha^2} \qquad \text{(Expression 7)}$$

Figure 8:
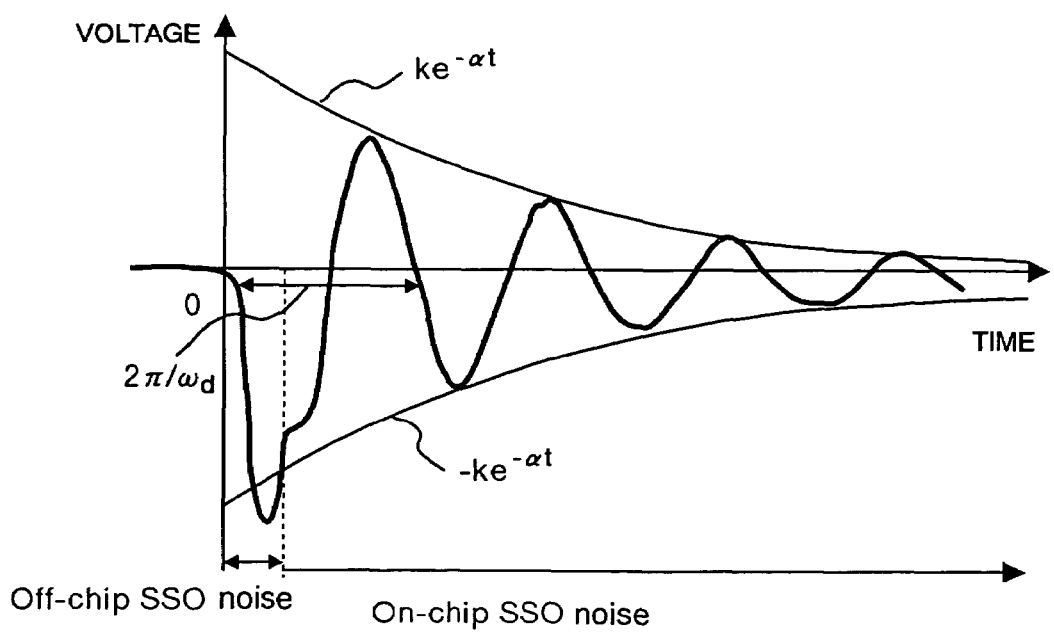
FIG. 8 is an explanatory diagram showing the waveform of an On-Chip SSO noise signal.

When such a current flows through the power feed line, the voltage noise represented by expression 8 below occurs in the power supply and grounding inductance elements.

$$V_{sso}=k \cdot e^{-\alpha t} \sin(\omega_d t+\phi) \qquad \text{(Expression 8)}$$

where "k" denotes maximum noise amplitude. This is due to the fact that the voltage developed at the inductance elements is determined by a product of inductance and current differentiated by time. The On-Chip SSO noise waveform occurring in an underdamped condition is shown in FIG. 8.

When $R_{pg}=200$ m$\Omega$, $C_{dec}=500$ pF, and $L_{pkg}=1$ nH are assigned as physical quantities of a general semiconductor chip/semiconductor package, a damping time "$\tau(=1/\alpha)$", the time required for noise to settle down in an underdamped state of $Q \gg \frac{1}{2}$, becomes 10 ns, which is equivalent to a time as much as 10 periods with respect to a 1-GHz signal.

As opposed to such underdamped state of noise, a state in which noise oscillation immediately settles down is referred to as overdamping, and a condition necessary for the noise to enter this state is $Q<\frac{1}{2}$. Also, the very boundary in state between underdamping and overdamping is referred to as critical damping, which is established when $Q=\frac{1}{2}$.

If noise of either of the above three kinds occurs in the power supply line, the noise becomes a problem since that means that noise has occurred in signal lines of the output buffer sharing the power supply and grounding lines.

The power supply and grounding lines are usually designed to ensure low resistance. Therefore, "$R_{pg}$" is small, and this results in $Q \gg \frac{1}{2}$, i.e., an underdamped state in which the On-Chip SSO noise as shown in FIG. 8 is occurring. This is how the noise occurs.

Figure 2:
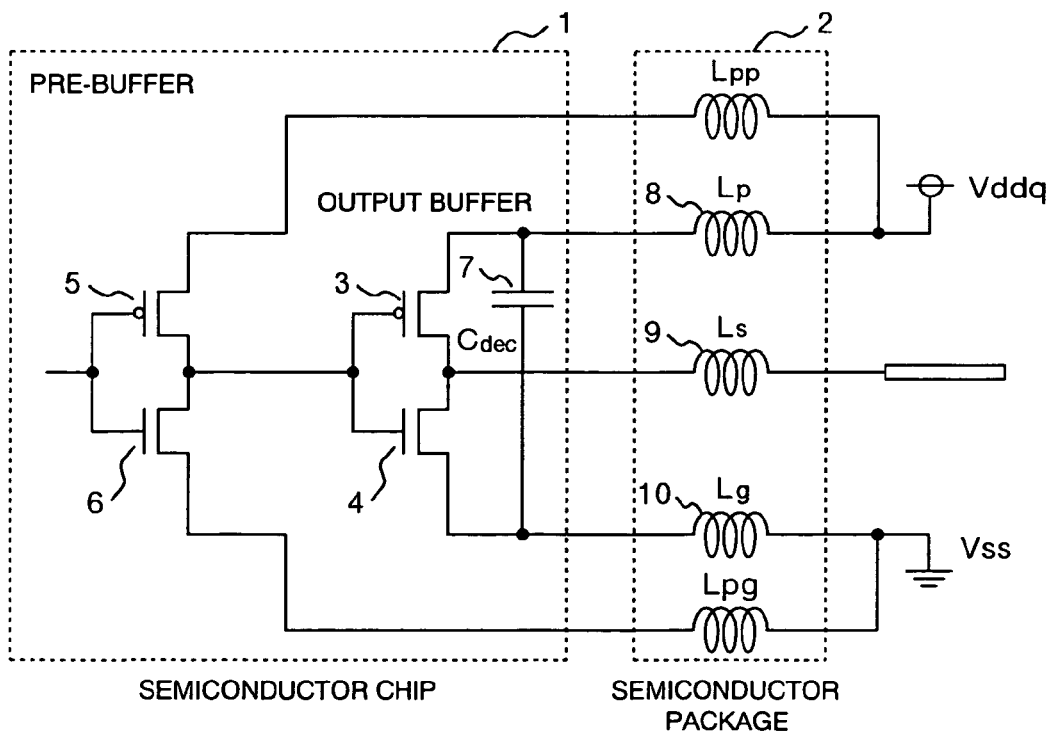
FIG. 2 is an explanatory diagram showing the simplified equivalent circuit used in the prior art.

In such method as shown in FIG. 2, in which an independent power feed line is provided for a control circuit and an output buffer each as in the prior art, the above noise does not affect the signals sent from the output buffer. However, there is the problem of increases in the inductance values of the power supply/grounding pins and the power feed lines.

Embodiment 1 provides a method of suppressing the occurrence of such noise by varying the routes of power feed during charging of the switching elements of the control circuit such as a pre-buffer. A simplified equivalent circuit for realizing the suppression of the noise is shown in FIG. 1.

This circuit differs from the general circuit model of FIG. 7 in that an on-chip bypass capacitor 11 is mounted between the output buffer and control circuit and in that a resistor 12 is inserted into the power supply line existing between the capacitor 11 and the output CMOS section.

Figure 1:
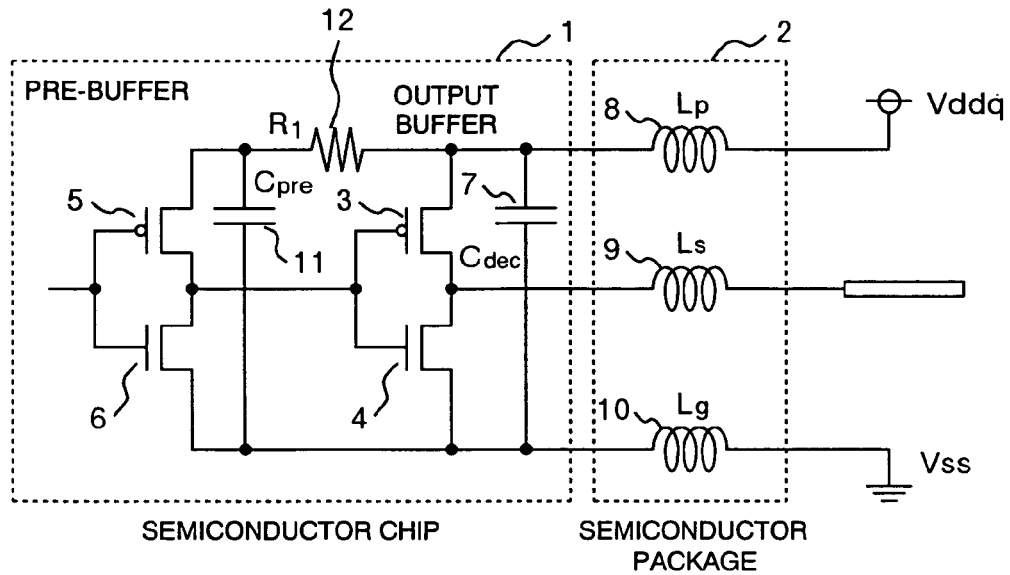
FIG. 1 is an explanatory diagram showing a simplified equivalent circuit (Embodiment 1) that implements reduction in switching noise.

In the circuits of FIG. 1, when the PMOS 5 and the NMOS 6 are switched, the charge lost by discharging is almost compensated for by the charge supplied from the bypass capacitor 11, the circuit element closest to the PMOS 5 and the NMOS 6. That is due to the fact that since the resistor 12 is inserted between the output CMOS section and the capacitor 11, impedance appears to be high at positions distant from the resistor 12. Although the capacitor 11 is charged primarily by the capacitor 7, since the resistor 12 exists, a steep change in current does not occur because of a large time constant. Accordingly, excitation of a zeroth-order input current by the charging/discharging of the capacitor 7 does not almost occur and as a result, substantially no On-Chip SSO noise arises. The resistor inserted in FIG. 1 is to have at least 1.8 times resistivity of other power feed line.

The resistor is inserted only into the power supply side because, if a resistor is inserted into the grounding side, an increase in grounding potential due to the insertion of the resistor can change a reference potential, thus causing output signal jitter.

In the present embodiment, an on-chip capacitor mounting space for the control circuit needs to be provided in the chip.

(Embodiment 2)

One method of suppressing On-Chip SSO noise is, as described in the section on how the noise occurs, by changing a noise-inducing current to an overdamped state. Overdamping is accomplished by assigning the electrical parameters that satisfy $Q<\frac{1}{2}$ in the conditional expression. This can be realized by reducing L, increasing C, or increasing R. Changing L or C, however, requires using unrealistic, physical parameters (e.g., a capacitance of 100 nF, an inductance of 10 pH, and/or others). In the present invention, a resistance value of power feed lines is increased to achieve an overdamped state. The resistance value required here is represented using the following expression 1:

$$R_{pg} \geq 2\sqrt{\frac{L_{pkg}}{C_{dec}}} \qquad \text{(Expression 1)}$$

Figure 3:
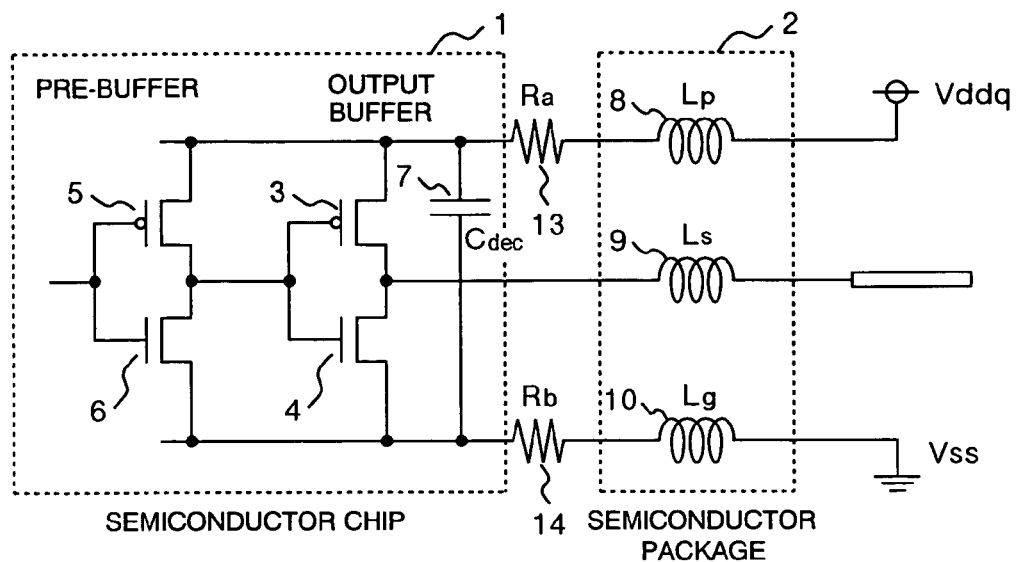
FIG. 3 is an explanatory diagram showing another simplified equivalent circuit (Embodiment 2) that implements reduction in switching noise.

A circuit composition with resistors inserted between a semiconductor chip and a semiconductor package in order to satisfy the condition of expression 1 is Embodiment 2, a simplified equivalent circuit of which is shown in FIG. 3. Embodiment 2 is characterized in that depending on electrical characteristics of the semiconductor chip and the semiconductor package, an appropriate resistance value to be applied to a section at which the chip and the package are connected can be selected. To obtain a noise suppression effect, the terminal-to-terminal voltage waveform of an output buffer that suffers damped oscillation needs to be damped to at least ½ of a voltage waveform of an input signal to the output buffer, after one period of the input signal.

Figure 4:
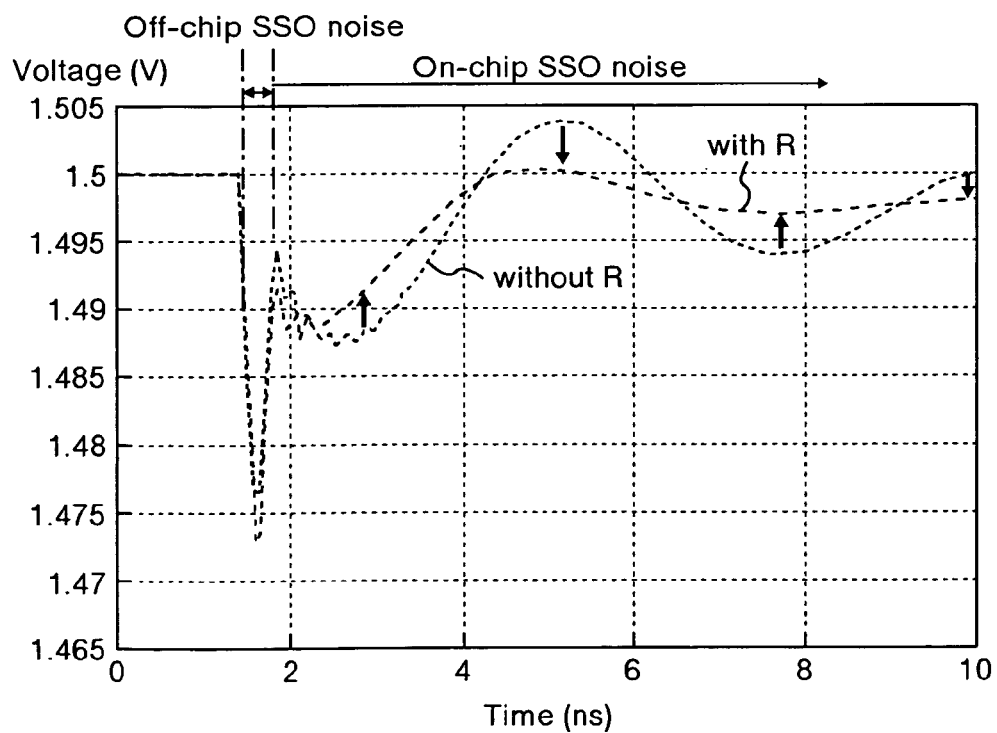
FIG. 4 is an explanatory diagram showing an effect of Embodiment 2.

In FIG. 3, resistors 13 and 14 are inserted into such general circuit as shown in FIG. 7. The resistors 13 and 14 are to have resistance values whose sum satisfies expression 1. An effect by the insertion of the resistors is shown in FIG. 4. In a semiconductor device having plural output buffers, when a "High" output to a signal line in one of the plural output buffers is maintained at a fixed level and output levels of all other output buffers change from "High" to "Low", voltage waveforms of the signal line fixed at the "High" output level look as in FIG. 4 which shows simulated observations on the waveforms. It can be seen that the voltage waveforms that originally should be fixed at a level of 1.5 V are significantly oscillated by SSO noise. Two waveforms are shown in FIG. 4, wherein one waveform is denoted by a solid line and the other waveform is denoted by a dotted line. The dotted line shows the waveform generated without the above resistors inserted into the circuit, and the solid line shows the waveform generated with the resistors inserted. As is obvious from the figure, the On-Chip SSO noise is suppressed by the insertion of the resistors.

In the present embodiment, since the resistors are inserted into power feed lines, a resistance value of a power supply potential decreases and a grounding potential increases. It is preferable that to ensure equal noise margins between the "High" side and the "Low" side, an equivalent circuit operating analogously to a secondary circuit should be designed so that the resistor inserted into a power supply line and the resistor inserted into a grounding line are substantially equal in resistance value.

(Embodiment 3)

Figure 5:
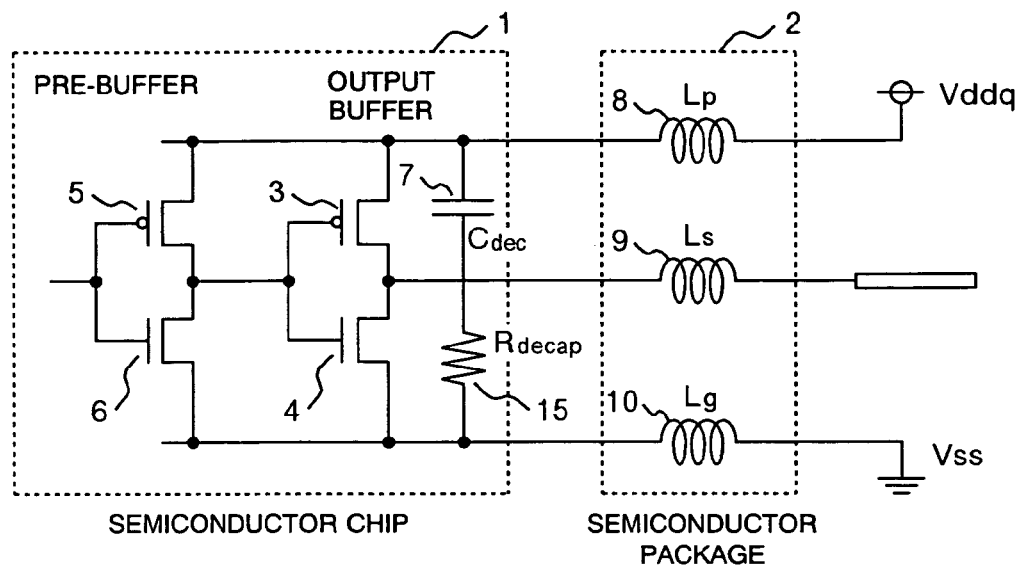
FIG. 5 is an explanatory diagram showing yet another simplified equivalent circuit (Embodiment 3) that implements reduction in switching noise.

A circuit composition with a resistor inserted in series into an on-chip capacitor in order to satisfy the condition of expression 1 is Embodiment 3, a simplified equivalent circuit of which is shown in FIG. 5. Embodiment 3 is characterized in that it suppresses noise without reducing a resistance value of a power supply potential or increasing a grounding potential.

Figure 6:
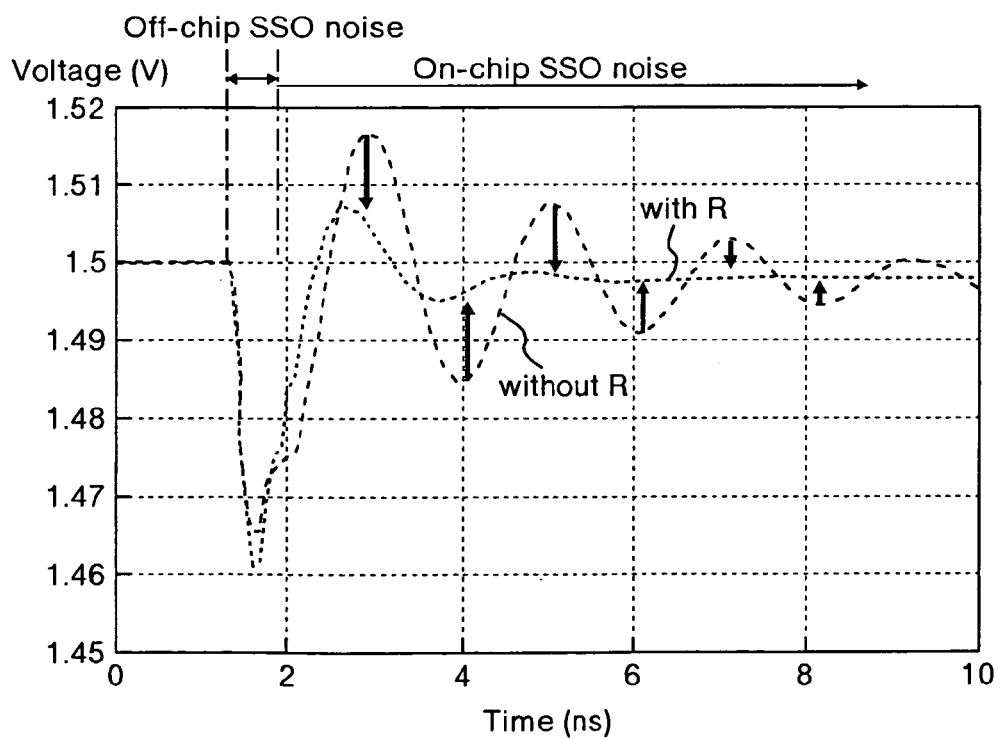
FIG. 6 is an explanatory diagram showing an effect of Embodiment 3.

In FIG. 5, a resistor 15 is inserted into such general circuit as shown in FIG. 7. The resistor 15 is to have a resistance value that satisfies expression 1. An effect by the insertion of the resistor is shown in FIG. 6. In a semiconductor device having plural output buffers, as with the semiconductor device of FIG. 4, when a "High" output to a signal line in one of the plural output buffers is maintained at a fixed level and output levels of all other output buffers change from "High" to "Low", voltage waveforms of the signal line fixed at the "High" output level look as in FIG. 6 which shows simulated observations on the waveforms. It can be seen that the voltage waveforms that originally should be fixed at a level of 1.5 V are significantly oscillated by SSO noise. Two waveforms are shown in FIG. 6, wherein one waveform is denoted by a solid line and the other waveform is denoted by a dotted line. The dotted line shows the waveform generated without the above resistor inserted into the circuit, and the solid line shows the waveform generated with the resistor inserted. As is obvious from the figure, the On-Chip SSO noise is suppressed by the insertion of the resistor.

In the present embodiment, if the resistance value is increased too greatly, validity of the on-chip capacitor is deteriorated and the On-Chip SSO noise reduction effect (or the like) yielded by the capacitor is adversely affected. This is due to the fact that since impedance equivalent to the resistance value is added to an impedance value of the on-chip capacitor in all frequency bands, even a high-frequency current originally to be bypassed deteriorates in fluidity.

(Embodiment 4)

Figure 9:
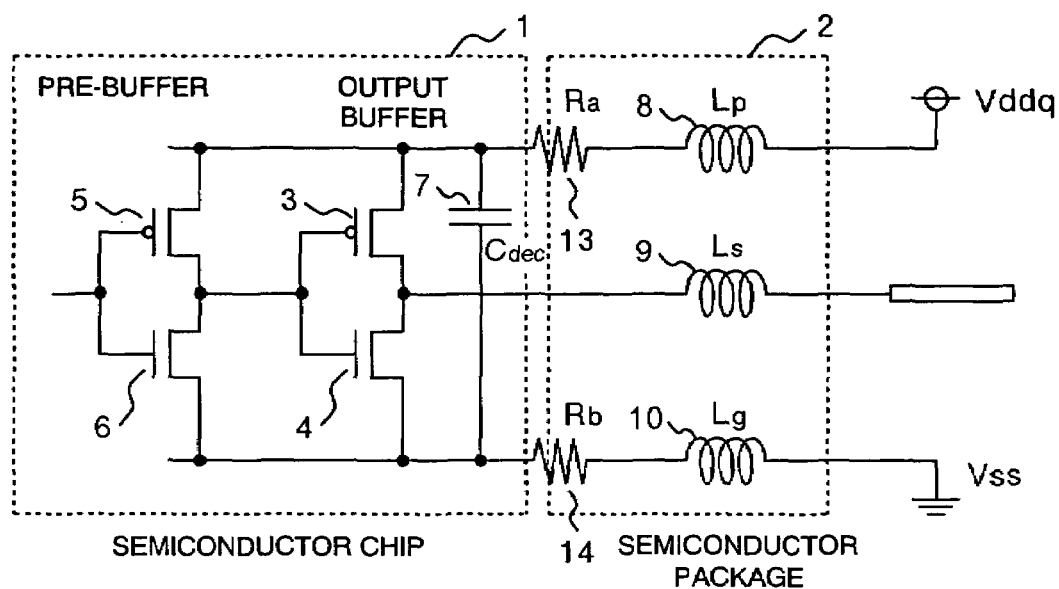
FIG. 9 is an explanatory diagram showing a further, simplified equivalent circuit (Embodiment 4) that implements reduction in switching noise.

A circuit composition with resistors inserted into power feed lines of a semiconductor package in order to satisfy the condition of expression 1 is Embodiment 4, a simplified equivalent circuit of which is shown in FIG. 9. Embodiment 4 is characterized in that in the semiconductor package, resistance is relatively easy to be controllable using the VIAs that connect internal power supply (grounding) layers of the package. That is because the resistance can be changed according to a particular thickness of the VIAs, the number of VIAs, or the kind of metallic material used for the VIAs.

In the present embodiment, since the resistors are inserted into power feed lines similarly to Embodiment 2, there occur a decrease in a resistance value of a power supply potential and an increase in grounding potential. It is preferable that to ensure equal noise margins between the "High" side and the "Low" side, an equivalent circuit operating analogously to a secondary circuit should be designed so that the resistor inserted into a power supply line and the resistor inserted into a grounding line are almost equal in resistance value. At the same time, however, since the resistors are to be inserted into the package beforehand, a designer needs to have, during a phase of the above design, a knowledge of an impedance profile (such as "$C_{dec}$") of the power feed line that a semiconductor chip possesses.

(Embodiment 5)

Figure 10:
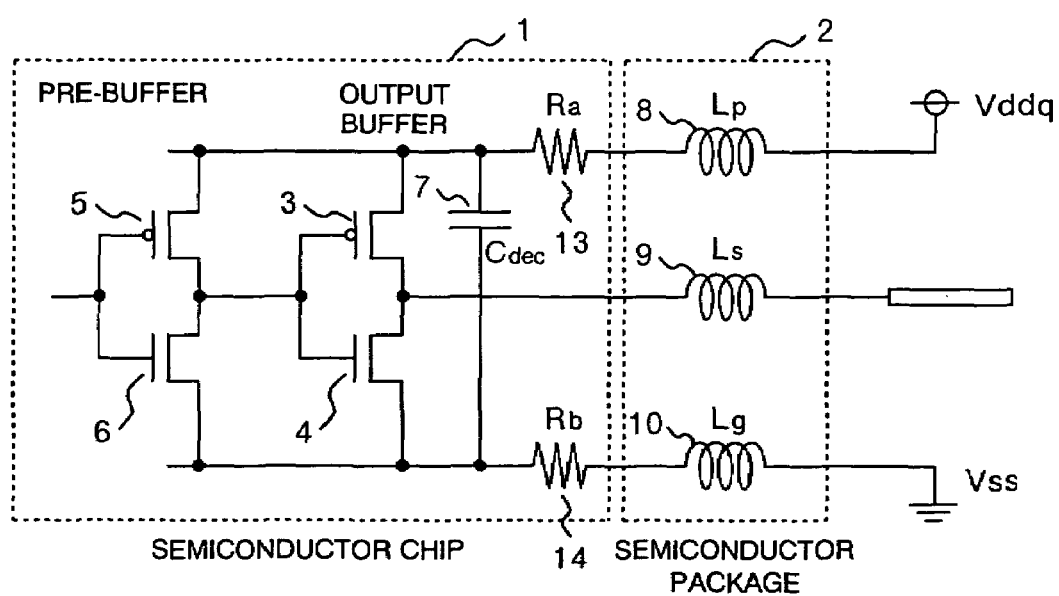
FIG. 10 is an explanatory diagram showing a further, simplified equivalent circuit (Embodiment 5) that implements reduction in switching noise.
Figure 16:
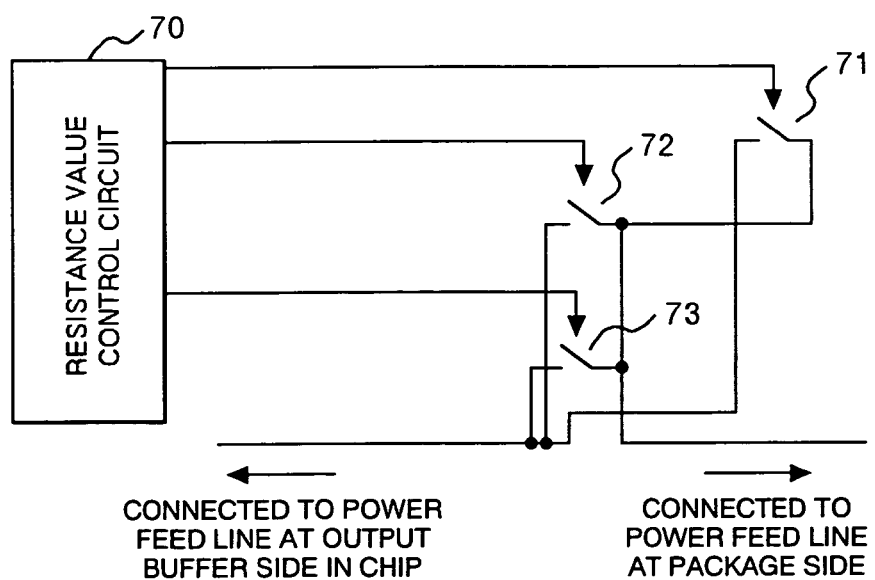
FIG. 16 shows an example of realizing a power feed line resistance selector mountable in a chip.

A circuit composition with resistors inserted into power feed lines of a semiconductor chip in order to satisfy the condition of expression 1 is Embodiment 5, a simplified equivalent circuit of which is shown in FIG. 10. Embodiment 5 is characterized in that in the semiconductor chip, resistance is relatively easy to be controllable using the VIAs that connect internal power supply (grounding) layers of the chip. That is because the resistance can be changed according to a particular thickness of the VIAs, the number of VIAs, or the kind of metallic material used for the VIAs. A possible alternative to the resistance change is to mounting switch-selectable or metal-option-selectable resistors in the chip, and designing the chip so that before or after the chip is sealed in a package, the optimum value of RCL can be selected according to particular specifications of the package. An example of switch-selectable resistor composition is shown in FIG. 16. In FIG. 16, after a resistance value has been determined on the basis of electrical parameters for a power feed circuit formed of a semiconductor chip/semiconductor package combination, the optimum resistance value is applied to power feed lines by combining on/off operations on MOS 71 to MOS 73, each of which has a different resistor for turning on the MOS. Although only three MOS's are shown in FIG. 16, the number of MOS's can be either smaller or greater than three. A resistance value control circuit 70 has a function for calculating from external information the optimum resistance value to be applied, and on the basis of this value, determining which of the MOS's is to be turned on.

In the present embodiment, since the resistors are inserted into the power feed lines similarly to Embodiment 2, there occur a decrease in a resistance value of a power supply potential and an increase in grounding potential. It is preferable that to ensure equal noise margins between the "High" side and the "Low" side, an equivalent circuit operating analogously to a secondary circuit should be designed so that the resistor inserted into a power supply line and the resistor inserted into a grounding line are almost equal in resistance value.

(Embodiment 6)

Figure 11:
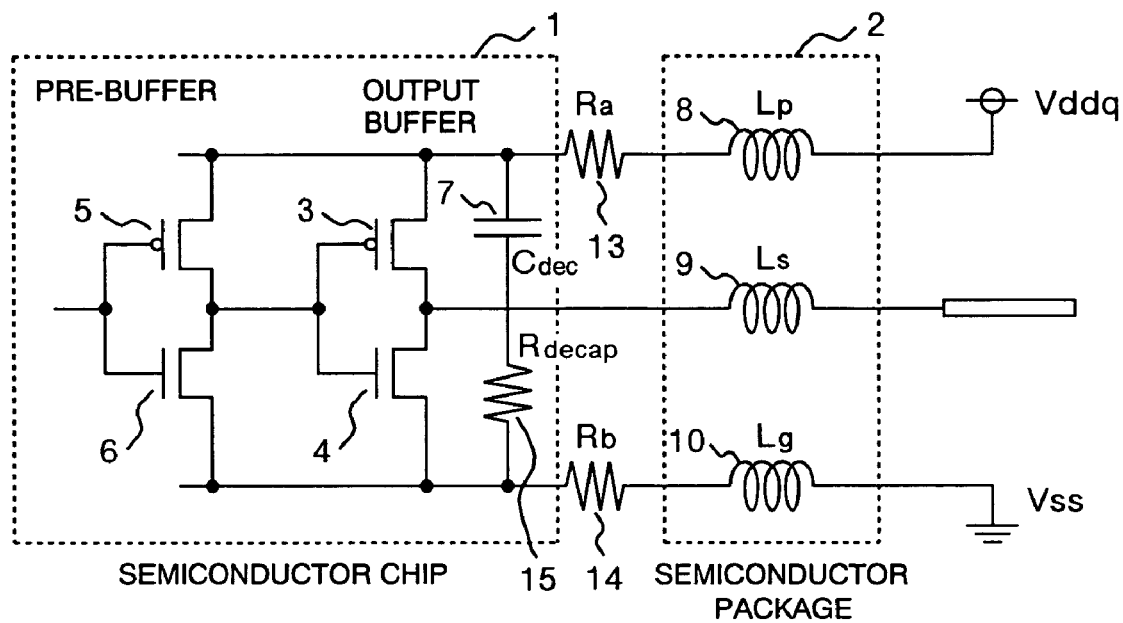
FIG. 11 is an explanatory diagram showing a further, simplified equivalent circuit (Embodiment 6) that implements reduction in switching noise.

A circuit composition with resistors inserted into power feed lines between a semiconductor chip and a semiconductor package, and furthermore, a resistor inserted in series into an on-chip bypass capacitor, in order to satisfy the condition of expression 1, is Embodiment 6, a simplified equivalent circuit of which is shown in FIG. 11. In other words, Embodiment 6 is a combination of Embodiments 2 and 3. Combination of Embodiments 2 to 5 is arbitrary, and a combination other than that adopted as Embodiment 6 can be used instead. Embodiment 6 is characterized in that it is possible to reduce resistance values to be applied to the on-chip bypass capacitor and a power feed line. Adverse effects on the bypass capacitor and a decrease in resistance can thus be alleviated.

The resistors inserted are to be selected so that a sum of all resistance values satisfies expression 1.

In the present embodiment, performance deterioration of the on-chip bypass capacitor, a decrease in resistance of a power supply potential, and an increase in grounding potential occur at the same time if inappropriate resistors are selected.

(Embodiment 7)

Methods of mounting in Embodiments 2 to 6 are described as Embodiment 7 in detail below. A sectional view of the semiconductor chip sealed in a semiconductor package is shown in FIG. 14.

First, when resistors are to be inserted between a semiconductor chip and a semiconductor package as in Embodiment 2, this is possible by, as shown, depositing a resistance thin film 18-1 at an electrode pad section which connects the semiconductor chip and the semiconductor package. A method available to form a resistance thin film is by, as in Japanese Patent Laid-Open No. Hei 6-140215, using as the resistance layer a thin film constituted mainly by chromium (Cr), silicon (Si), and oxygen (O). Instead of these materials, other known resistor materials (namely, materials that contain $RuO_2$, $M_2RuO_{7-x}$, $MoO_2$, $LaB_6$, or the like) or tungsten (W), a tungsten silicide, a tungsten compound, or a diffusion layer can be used.

Resistivities of the resistor materials usable for noise reduction are shown below. The resistivities required range from $5 \times 10^{-6}$ Ωcm to $5 \times 10^{-3}$ Ωcm, which are at least 1.8 times as great as a resistivity of about $1.7 \times 10^{-6}$ Ωcm of an ordinary copper conductor or a resistivity of about $2.75 \times 10^{-6}$ Ωcm of aluminum. Of the materials mentioned above as the usable resistor materials, tungsten and molybdenum, both having a low resistivity compared with those of other materials, are about $6 \times 10^{-6}$ Ωcm in resistivity. The series resistor insertion into an on-chip capacitor, shown in Embodiment 3, is possible by using either of two methods: (1) applying high resistance to the VIAs that connect an on-chip capacitor 24 and a power feed line (see 20-2, FIG. 14), or (2) interposing the above-mentioned resistance thin film when connecting the on-chip capacitor and the power feed line (see 18-2, FIG. 14).

Figure 14:
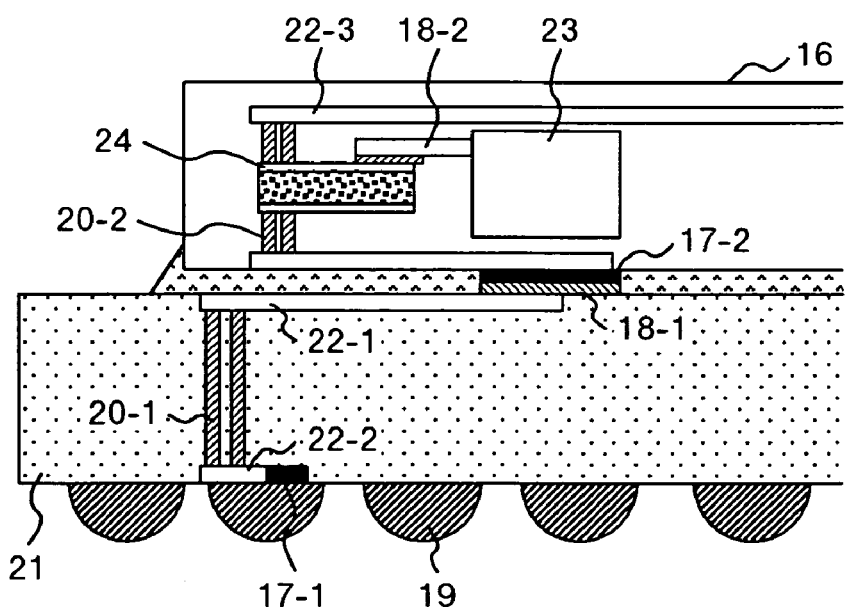
FIG. 14 shows an example of semiconductor chip and semiconductor package mounting (Embodiment 7) in which reduction in switching noise is implemented.

The resistor insertion into a semiconductor package, shown in Embodiment 4, is possible by applying high resistance to the VIAs shown as 20-1 in FIG. 14.

The resistor insertion into a semiconductor chip, shown in Embodiment 5, is possible by using the resistance value control circuit shown in FIG. 16, or by, when changing a power feed line layer, applying high resistance to the VIAs shown as 20-2 in FIG. 14.

(Embodiment 8)

Figure 12:
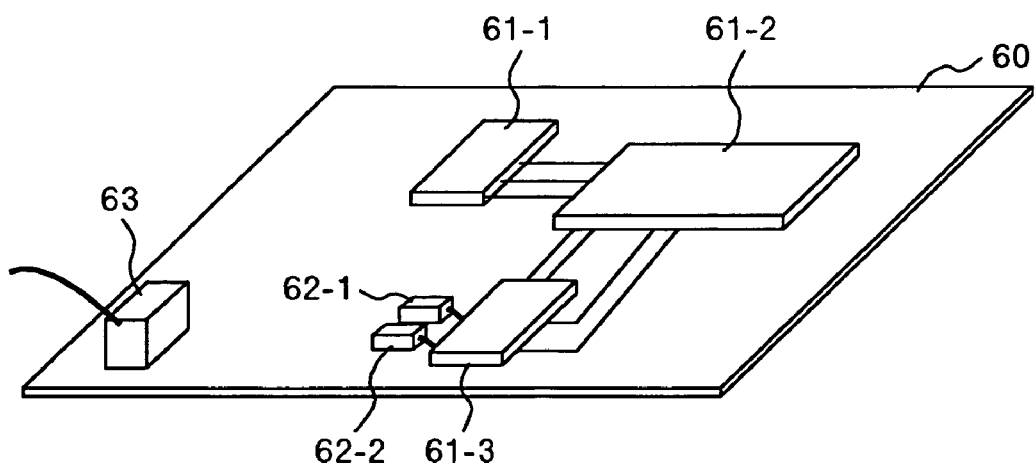
FIG. 12 is an explanatory diagram showing an example of mounting (Embodiment 8) for the implementation of switching noise reduction in SIP.

A method of reducing noise in SIP (System In Package) is described as Embodiment 8 below. An explanatory diagram is shown in FIG. 12. Power is supplied to the SIP via the power supply connector 63 shown in the figure. For the SIP, the block leading from the connector 63 to a power feed line section in each of the LSIs 61-1 to 61-3 mounted in the SIP can also be modeled as a power feed route. Accordingly, there is a method in which resistance values to be applied are determined on the basis of electrical parameters for a power feed line loop when it is viewed from the connector 63 in the figure, and then, chip resistors 62-1, 62-2 are mounted directly on a board 60 of the SIP. The resistors mounted at this time are to have the resistance values that satisfy expression 1, in the power feed loop when viewed from the power supply connector 63. It is to be noted, however, that electrode pads of the board for mounting the chip resistors need to be designed so as to obtain sufficiently low inductance.

(Embodiment 9)

Figure 13:
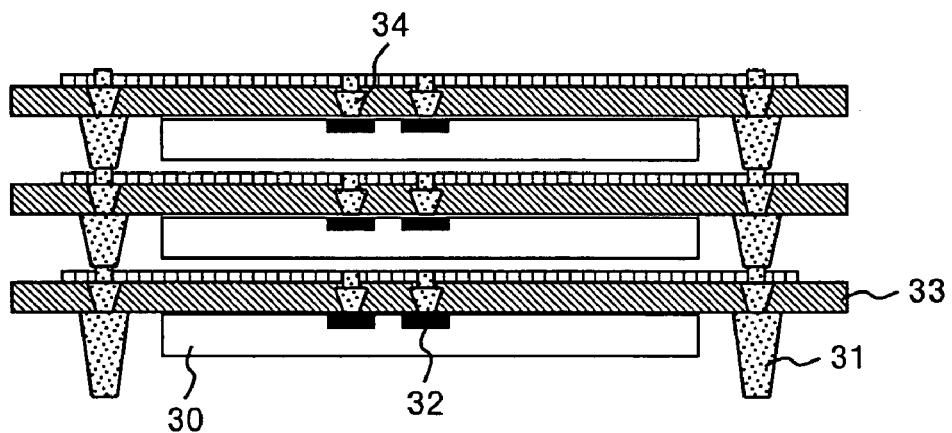
FIG. 13 is an explanatory diagram an example of mounting (Embodiment 9) for the implementation of switching noise reduction in a three-dimensional mounting-type package.

A method of reducing noise in a semiconductor device of a three-dimensional mounting-type package is described as Embodiment 9 below. An explanatory diagram is shown in FIG. 13. Although, in FIG. 13, three semiconductor chips are built into one stacked-type module, the number of chips can be either greater or smaller than three. Electrical parameters for the LSIs that are to be stacked in the module may be the same or may be different for each LSI. Also, electrical parameters (especially, inductance) for power feed lines differ according to a stage on which the LSI is to be stacked. Accordingly, in consideration of a mass-production process, it is preferable that resistor insertion positions be obtained by, as shown in 13, inserting a resistance thin film at each of the electrode pads 32 that connect the LSIs and the package. Instead, the resistance value control circuit shown in FIG. 16 may be mounted in each of semiconductor chips 30.

Figure 15:
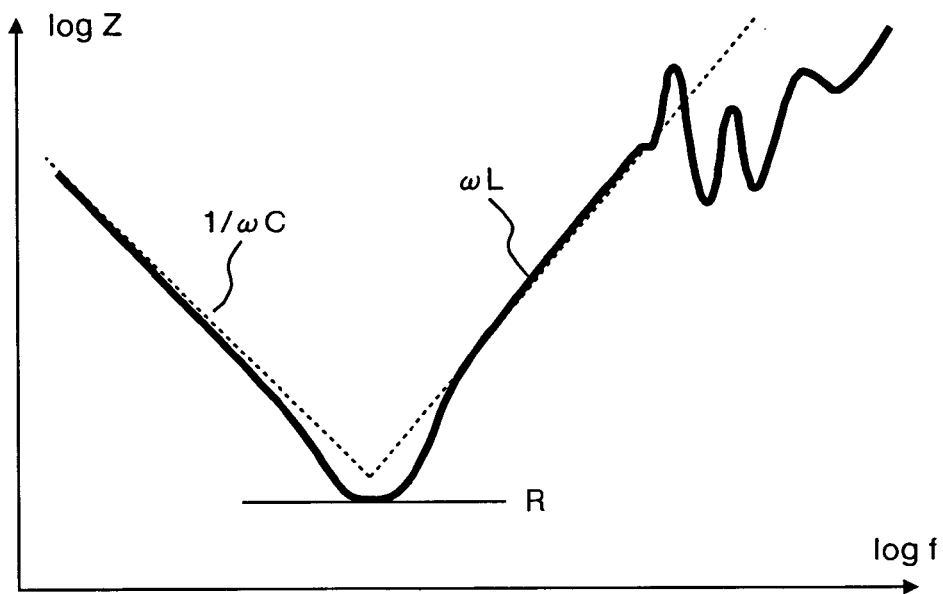
FIG. 15 shows an impedance profile of the power feed line in a semiconductor chip/semiconductor device combination.

Finally, a method of determining electrical parameters for a power feed route is described below. For a semiconductor device of complex circuit composition, it is desirable that an impedance value of a power feed system be measured and a circuit diagram be assumed from the impedance profile obtained. An example of a power feed line impedance profile of a semiconductor chip/semiconductor package combination is shown in FIG. 15. As seen in the figure, capacitive characteristics at low frequencies, L-like (inductive) characteristics at high frequencies, and a resistance value applied to a power feed route by the impedance at a resonance frequency are shown. Although anti-resonance/resonance are further observed at even higher frequencies, the power feed route basically has its R, L, and C values derived with reference to the characteristics developed at the low-frequency side. The resistance value can be determined by deriving the condition of expression 1 from those values. If plural blocks each having a completely separated power feed line are present in one semiconductor chip, a resistance value appropriate for each of the blocks is to be determined by conducting a modeling operation for each block. If plural power supply/grounding pins are to be connected in-chip or in-package to a single power feed line, a simple circuit model can be generated by electrically strapping the power supply/grounding pins.

(Embodiment 10)

In Embodiment 10, consider a case in which the concept of overdamping is also applied to a reference voltage.

A memory such as a DRAM uses a reference voltage to judge whether an input signal level is "High" or "Low". Half a value of "Vddq" is usually used as the reference voltage, and an independent power supply line for supplying the reference voltage is provided.

Although a line of the reference voltage (Vref) usually does not have an on-chip bypass capacitor between in-chip power supply/grounding lines, a parasitic capacity exists between the Vref line and the power supply/grounding lines. Part of the On-Chip SSO noise occurring in the power supply/grounding lines may be induced into the Vref line via the parasitic capacity "$C_{para}$".

Figure 17:
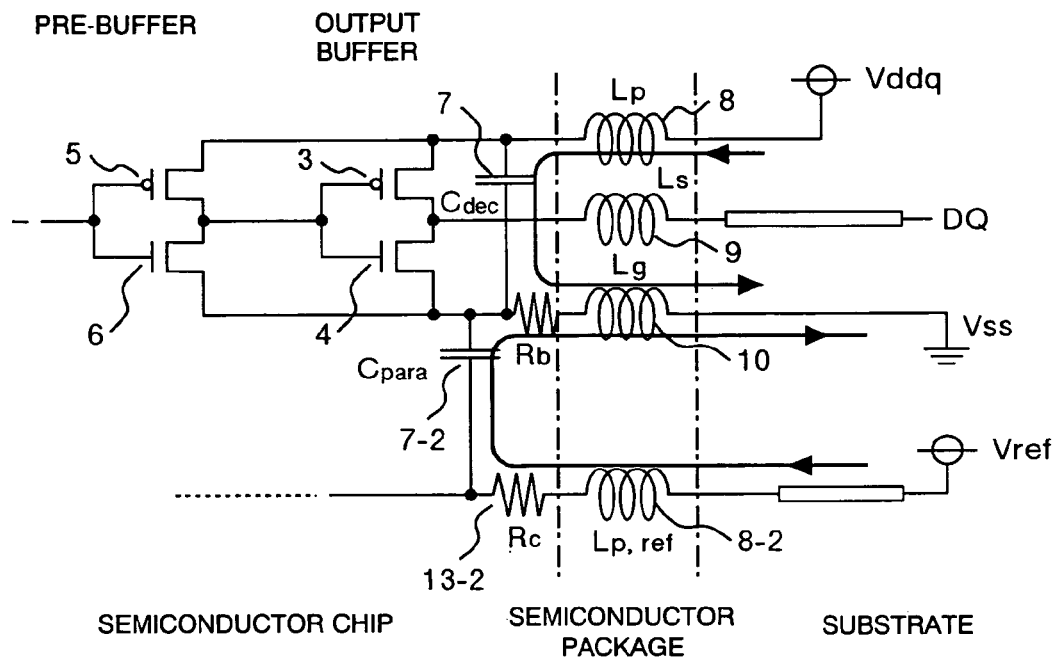
FIG. 17 a diagram that shows resistor mounting in a chip as an embodiment of noise suppression (Embodiment 10)
Figure 18:
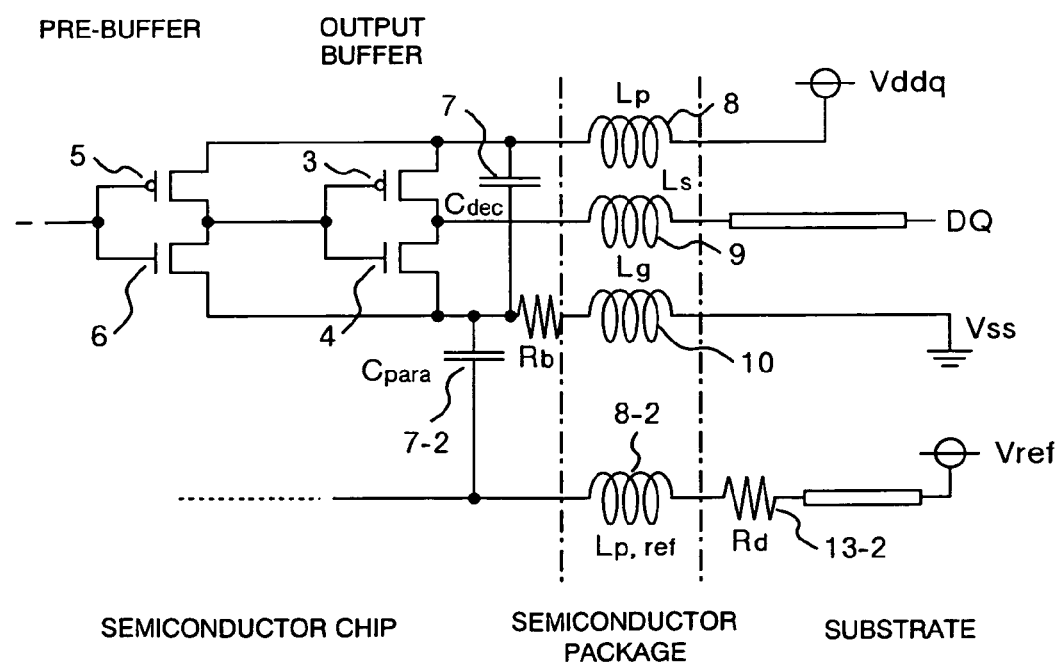
FIG. 18 a diagram that shows resistor mounting on a substrate as an embodiment of noise suppression (Embodiment 10)

Methods in which, as shown in FIGS. 17 and 18, resistors are to be inserted are available to suppress noise due to such induction. Of all methods heretofore discussed, any method of mounting in a chip or a package or on a substrate can be applied to the insertion of the resistors. Mounting the resistors in a chip is shown in FIG. 17, and mounting them on a substrate is shown in FIG. 18.

The resistor insertion condition to be satisfied is that the inductance of the power loop between the reference voltage and the ground should be applied as "$C_{dec} \rightarrow C_{para}$" to the required conditional expression.

A wiring method on in-chip power supply/grounding lines is described below.

Figure 19:
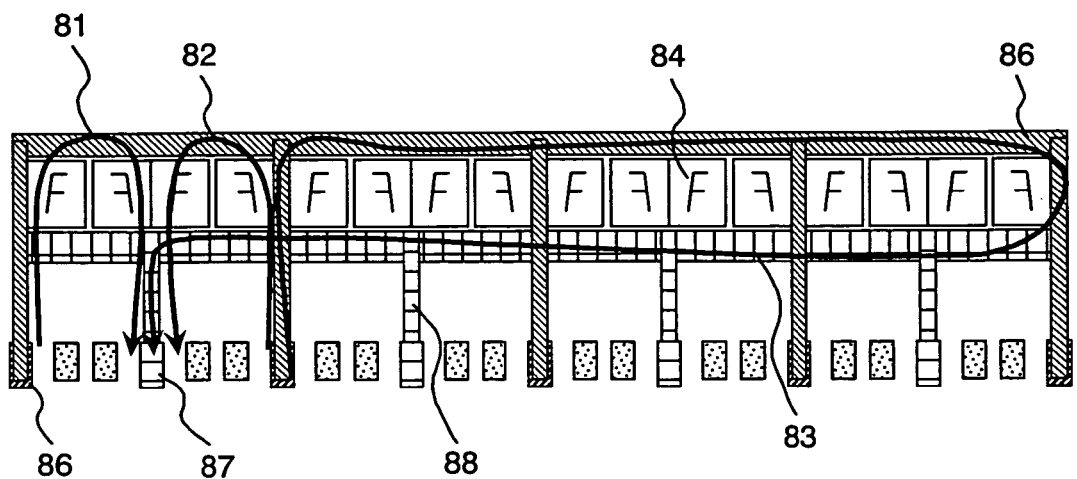
FIG. 19 exemplifies the conventional method of power supply/grounding line wiring in a chip.

In a conventional method of wiring in-chip power supply/grounding lines, for wiring from plural power supply (or grounding) pads 86 (or 87) to plural output circuits, connections have been conducted so that all power supply (or grounding) pads 85 (or 88) are shared, as in FIG. 19.

However, when, as in the present invention, a resistance value for noise reduction is to be determined using the electrical parameters of a power feed line loop, the above conventional method is unlikely to satisfy an overdamping-related condition since there is a difference in current route. For example, in the case of FIG. 19, although there are four grounding pads in all, current does not necessarily flow uniformly into the four grounding pads. For example, when a route of the current flowing into the grounding pad at the left end is considered, not only such a current as taking a current route 1 (81) or a current route 2 (82) and flowing via a neighboring pad, but also such a current as taking current route 3 (83) is likely to occur. In this case, the effectiveness of resistors may not be utilizable to its maximum, for reasons such as a difference in the inductance of a power feed network between the routes 1, 2, and the route 3.

Figure 20:
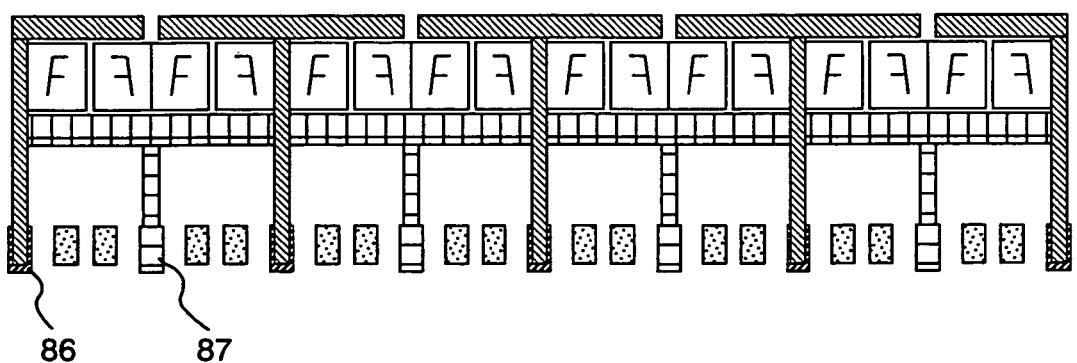
FIG. 20 exemplifies a method of power supply/grounding line wiring in a chip according to the present invention (Embodiment 11).

As shown in FIG. 20, therefore, in-chip wiring is preferably isolated to ensure an equal number of loads applied to an output circuit 84/control circuit when power is fed from each of power supply pads 86/grounding pads 87. This method facilitates designing of a noise reduction resistance value, thus making it unnecessary to allow for noise due to formation of unnecessary current loops.

The symbols used in the drawings accompanying this application are as follows:
- 1 . . . Semiconductor chip,
- 2 . . . Semiconductor package,
- 3 . . . PMOS for output buffer,
- 4 . . . NMOS for output buffer,
- 5 . . . PMOS for pre-buffer (or control circuit or core circuit),
- 6 . . . NMOS for pre-buffer (or control circuit or core circuit),
- 7 . . . On-chip bypass capacitor,
- 8 . . . Power supply line (inductance) of the semiconductor package,
- 9 . . . Signal line (inductance) of the semiconductor package,
- 10 . . . Grounding line (inductance) of the semiconductor package,
- 11 . . . On-chip capacitor for pre-buffer (or control circuit or core circuit),
- 12 . . . Decoupling resistor between pre-buffer (or control circuit or core circuit) and output buffer,
- 13 . . . Resistor for noise reduction at power supply side,
- 14 . . . Resistor for noise reduction at grounding side,
- 15 . . . Noise reduction resistor connected in series to on-chip capacitor,
- 16 . . . Semiconductor chip,
- 17-1, -2 . . . Electrode pads,
- 18-1, -2 . . . Resistance thin films,
- 19 . . . BGA ball,
- 20-1, -2 . . . VIAs,
- 21 . . . Semiconductor package,
- 22-1 to -3 . . . Power feed line (layers),
- 23 . . . Output circuit,
- 24 . . . On-chip bypass capacitor,
- 30 . . . Semiconductor chip,
- 31 . . . Electrode bump,
- 32 . . . Resistance thin-film electrode pad,
- 33 . . . LCP,
- 34 . . . Micro VIA,
- 50 . . . Pre-buffer charging current route
- 51 . . . On-chip capacitor charging current route
- 60 . . . Board of SIP,
- 61-1 to -3 . . . LSIs mounted in SIP,
- 62-1, -2 . . . Chip resistors for noise reduction,
- 63 . . . Power supply connector of the SIP board,
- 70 . . . Resistance value control circuit,
- 71 to 73 . . . MOS switches for resistance control,
- 81 . . . Current route 1,
- 82 . . . Current route 2,
- 83 . . . Current route 3,
- 84 . . . Output circuit (Output buffer+pre-buffer),
- 85 . . . Power supply wiring,
- 86 . . . Power supply pad,
- 87 . . . Grounding pad,
- 88 . . . Ground wiring.

What is claimed is:

1. A semiconductor device including a semiconductor chip and a substrate, said semiconductor chip including an output circuit and a control circuit, said semiconductor chip being mounted on said substrate, said semiconductor device comprising:
    a first electrode section provided on said substrate, said first electrode section having a power supply potential;
    a first connection terminal formed on said semiconductor chip, said first connection terminal being connected to a power supply potential terminal of said output circuit;
    a second electrode section provided on said substrate, said second electrode section having a grounding potential;
    a second connection terminal formed on said semiconductor chip, said second connection terminal being connected to a grounding potential terminal of said output circuit; and
    an on-chip bypass capacitor connected between said first and second connection terminals, said capacitor being provided at a position where it serves as a bypass for said output circuit;
    wherein, when
    an inductance value of a power feed line provided on said substrate in order to feed power to said semiconductor chip is taken as "$L_{pkg}$",
    a capacitance value that said on-chip bypass capacitor possesses is taken as "$C_{dec}$", and
    the total resistance value obtained by totaling a resistance value of the wiring provided on a route leading from said first electrode section through said on-chip bypass capacitor to said second electrode section, and a resistance value of a resistor independently provided on the way of the wiring route, is taken as "$R_{pg}$",
    said resistor that satisfies the following (Expression 1) is provided between said first connection terminal and said first electrode section and between said second connection terminal and said second electrode section:

$$R_{pg} \geq 2\sqrt{\frac{L_{pkg}}{C_{dec}}}. \qquad \text{(Expression 1)}$$

2. A semiconductor device including a semiconductor chip and a substrate, said semiconductor chip including an output circuit and a control circuit, said semiconductor chip being mounted on said substrate, said semiconductor device comprising:
    a first electrode section provided on said substrate, said first electrode section having a power supply potential;
    a first connection terminal formed on said semiconductor chip, said first connection terminal being connected to a power supply potential terminal of said output circuit;
    a second electrode section provided on said substrate, said second electrode section having a grounding potential;
    a second connection terminal formed on said semiconductor chip, said second connection terminal being connected to a grounding potential terminal of said output circuit; and
    an on-chip bypass capacitor connected between said first and second connection terminals, said capacitor being provided at a position where it serves as a bypass for said output circuit;

wherein, when an inductance value of a power feed line provided on said substrate in order to feed power to said semiconductor chip is taken as "$L_{pkg}$", a capacitance value that said on-chip bypass capacitor possesses is taken as "$C_{dec}$", and the total resistance value obtained by totaling a resistance value of the wiring provided on a route leading from said first electrode section through said on-chip bypass capacitor to said second electrode section, and a resistance value of a resistor independently provided on the way of the wiring route, is taken as "$R_{pg}$", said resistor that satisfies the following (Expression 1) is provided at said first electrode section and said second electrode section:

$$R_{pg} \geq 2\sqrt{\frac{L_{pkg}}{C_{dec}}} \:. \qquad \text{(Expression 1)}$$

* * * * *